United States Patent
Chen et al.

(10) Patent No.: US 10,290,714 B2
(45) Date of Patent: *May 14, 2019

(54) TRANSISTOR STRUCTURE WITH FIELD PLATE FOR REDUCING AREA THEREOF

(71) Applicant: TAIWAN SEMICONDUCTOR MANUFACTURING COMPANY LTD., Hsinchu (TW)

(72) Inventors: Jing-Ying Chen, Taipei (TW); Yu-Chang Jong, Hsinchu (TW); Shui-Ming Cheng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 35 days.

This patent is subject to a terminal disclaimer.

(21) Appl. No.: 15/168,844

(22) Filed: May 31, 2016

(65) Prior Publication Data
US 2017/0345902 A1    Nov. 30, 2017

(51) Int. Cl.
*H01L 29/40* (2006.01)
*H01L 29/78* (2006.01)
(Continued)

(52) U.S. Cl.
CPC ........ *H01L 29/402* (2013.01); *H01L 27/0259* (2013.01); *H01L 29/1008* (2013.01);
(Continued)

(58) Field of Classification Search
None
See application file for complete search history.

(56) References Cited

U.S. PATENT DOCUMENTS 4,978,630 A * 12/1990 Kim ................... H01L 21/266
                                                    148/DIG. 10
7,594,198 B2   9/2009 Chen
(Continued)

OTHER PUBLICATIONS

Ming-Dou Ker, Wei-Jen Chang, ESD Protection Design of Low-Voltage-Triggered p-n-p Devices and Their Failure Modes in Mixed-Voltage I/O Interfaces With Signal Levels Higher Than VDD and Lower Than VSS, IEEE Transactions on Device and Materials Reliability, Sep. 2005, pp. 1-12, vol. 5, No. 3.

*Primary Examiner* — Walter H Swanson
*Assistant Examiner* — Kien C Ly
(74) *Attorney, Agent, or Firm* — WPAT, P.C., Intellectual Property Attorneys; Anthony King

(57) ABSTRACT

In some embodiments, a BJT structure includes a base region, an emitter region formed in the base region and including an emitter doping region, a collector region including a collector doping region, an insulating structure and a field plate. The base region forms a junction with the collector region between the emitter and collector doping regions. The field plate is formed over an insulating structure over the junction. A first distance between the corresponding emitter and collector doping regions to the junction is shorter than a second distance in another BJT structure without the field plate corresponding to the first distance. The first distance causes a breakdown of the junction corresponding to a first breakdown voltage value between the emitter and collector doping regions being substantially the same or greater than a second breakdown voltage value of the other BJT structure corresponding to the first breakdown voltage value.

20 Claims, 9 Drawing Sheets

(51) Int. Cl.
*H01L 29/06* (2006.01)
*H01L 29/735* (2006.01)
*H01L 29/10* (2006.01)
*H01L 27/02* (2006.01)

(52) U.S. Cl.
CPC ...... *H01L 29/7816* (2013.01); *H01L 29/7835* (2013.01); *H01L 29/0649* (2013.01); *H01L 29/735* (2013.01)

(56) References Cited

U.S. PATENT DOCUMENTS

| | | | |
|---|---|---|---|
| 8,324,658 B2 | 12/2012 | Tsai et al. | |
| 8,334,571 B2 | 12/2012 | Tsai et al. | |
| 8,541,848 B2 | 9/2013 | Huang et al. | |
| 8,629,513 B2 * | 1/2014 | Su | H01L 29/404 257/409 |
| 8,730,626 B2 | 5/2014 | Tseng et al. | |
| 8,743,515 B2 | 6/2014 | Yang et al. | |
| 8,759,871 B2 | 6/2014 | Song et al. | |
| 8,760,828 B2 | 6/2014 | Ma | |
| 8,792,218 B2 | 7/2014 | Tsai | |
| 8,854,778 B2 | 10/2014 | Chu et al. | |
| 8,867,183 B2 | 10/2014 | Chen et al. | |
| 9,000,517 B2 * | 4/2015 | Chu | H01L 29/7816 257/336 |
| 9,035,393 B2 | 5/2015 | Ma et al. | |
| 9,048,655 B2 | 6/2015 | Meng et al. | |
| 9,069,924 B2 | 6/2015 | Chen | |
| 9,117,677 B2 | 8/2015 | Ma et al. | |
| 9,184,586 B2 | 11/2015 | Wang et al. | |
| 9,214,540 B2 | 12/2015 | Tsai et al. | |
| 9,362,272 B2 * | 6/2016 | Liu | H01L 27/088 |
| 2004/0036145 A1 * | 2/2004 | Haynie | H01L 21/28525 257/565 |
| 2010/0001369 A1 * | 1/2010 | Chuang | H01L 21/8249 257/526 |
| 2010/0065885 A1 * | 3/2010 | Ludikhuize | H01L 21/84 257/133 |
| 2012/0228695 A1 | 9/2012 | Toh et al. | |
| 2012/0286327 A1 * | 11/2012 | Coyne | H01L 27/0259 257/170 |
| 2013/0119433 A1 * | 5/2013 | Wang | H01L 27/0647 257/146 |
| 2014/0034999 A1 * | 2/2014 | Korec | H01L 29/7393 257/140 |
| 2014/0035032 A1 * | 2/2014 | Korec | H01L 21/8234 257/337 |
| 2014/0042515 A1 * | 2/2014 | Tseng | H01L 29/402 257/315 |
| 2014/0175611 A1 | 6/2014 | Hsu | |
| 2014/0217461 A1 | 8/2014 | Song et al. | |
| 2014/0226241 A1 | 8/2014 | Tseng et al. | |
| 2014/0307355 A1 | 10/2014 | Tsai et al. | |
| 2014/0339603 A1 * | 11/2014 | Kuo | H01L 27/0262 257/173 |
| 2015/0221731 A1 * | 8/2015 | Zeng | H01L 29/407 257/139 |
| 2015/0263085 A1 * | 9/2015 | Lee | H01L 29/42368 257/339 |
| 2016/0268245 A1 * | 9/2016 | Chen | H01L 27/0248 |
| 2016/0268423 A1 * | 9/2016 | Koepp | H01L 29/7825 |

* cited by examiner

TRANSISTOR STRUCTURE WITH FIELD PLATE FOR REDUCING AREA THEREOF

BACKGROUND

Electrostatic discharge (ESD) clamps are used to protect internal circuits from being damaged by ESI) events accidentally happened during fabrication, packaging and testing processes. The ESD clamps are applied to input/output (I/O), power (VDD/VSS) and switch pads of the internal circuits. The ESD clamps are turned off below a normal operating limit of the internal circuits and are broken down and triggered to be turned on at a voltage beyond the normal operating limit and below breakdown or catastrophic destruction of the internal circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
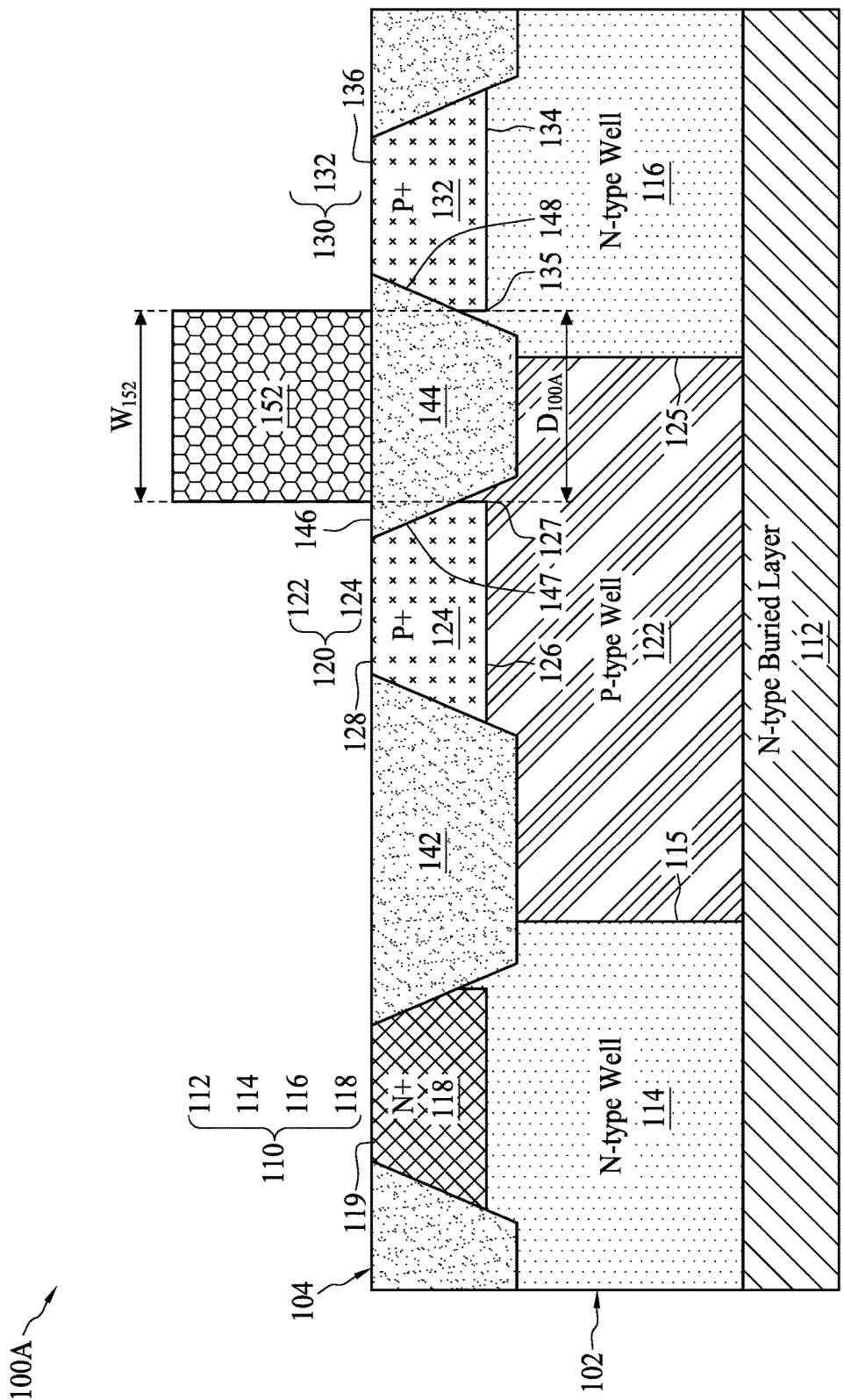
FIG. 1A is a schematic cross-sectional diagram of a BJT structure formed with a field plate over an STI interposed between a collector doping region and an emitter doping region and serving as an ESI) clamp, in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact, In addition, the present disclosure may repeat reference numerals and/or letters in the various examples. This repetition is for the purpose of simplicity and clarity and does not in itself dictate a relationship between the various embodiments and/or configurations discussed.

Same reference numerals among different embodiments indicate substantially the same elements. That is, comparable features in the different embodiments do not result in difference in the substantially the same elements. Like reference numerals among different embodiments and other approaches indicate corresponding elements. That is, corresponding elements in different embodiments or other approaches have differences resulted from comparable features in the different embodiments.

Spatially relative terms, such as "top" and "bottom", "above" and "below", "over" and "under", "upward" and "downward", "left" and "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It will be understood when an element is referred to as being "connected to" another element, the element is directly connected to the other element, i.e. the element is connected to the other dements without intervening elements.

It will be understood that when an element is referred to as being "above" another element, the element may be directly (i.e. at least partially overlapped with) above, or indirectly (i.e. not overlapped with) above the other element, When an element is referred to as being "over" another element, the element is directly above the other element. When an element is referred to as being "below" another element, the element may be directly below or indirectly below the other element. When an element is referred to as being "under" another element, the element is directly below the other element. For the terms "above", "over", "below" and "under", the element may be connected to the other element, or intervening elements may be present.

BJT Structure with Field Plate Formed between Collector Doping Region and Emitter Doping Region and with Base Region Surrounding Collector Region FIG. 1A is a schematic cross-sectional diagram of a BJT structure 100A formed with a field plate 152 over an STI 144 interposed between a collector doping region 124 and an emitter doping region 132 and serving as an ESD clamp, in accordance with some embodiments. The field plate 152 is disposed over the shallow trench isolation (STI) 144 interposed between the collector doping region 124 and the emitter doping region 132. Moreover, the collector doping region 124 and the emitter doping region 132 are separated from each other by a distance $D_{100A}$. The field plate 152 and the distance $D_{100A}$ result in breakdown of a pn junction 125 corresponding to a breakdown voltage value $BV_{WFP}$ between the emitter doping region 132 and the collector doping region 124.

In some embodiments, a bipolar junction transistor (BJT) structure 100A is implemented in a Bipolar-CMOS-DMOS (BCD) process. The BJT structure 100A implemented in other processes such as an extended voltage CMOS process, a BiCMOS process, a BJT process, etc. are within the contemplated scope of the present disclosure.

In some embodiments, the BJT structure 100A includes a substrate 102, and a field plate 152 over the substrate 102. The substrate 102 includes a base region 110, a collector region 120, an emitter region 130, and insulating structures which are STIs 142 and 144. The base region 110 includes a buried layer 112, wells 114 and 116, and a doping region 118. The collector region 120 includes a well 122 and a doping region 124. The emitter region 130 includes a doping region 132.

In some embodiments, the BJT structure 100A is a PNP BJT structure. A conductivity type of the base region 110 is n type. The doping region 118 is an N+ doping region. The wells 114 and 116 are N-type wells. The buried layer 112 is an N− type buried layer. The doping region 124 is a P+ doping region. The well 122 is a P-type well. The doping region 132 is a P+ doping region. The well 116 is an N-type well.

In some embodiments, the doping region 118 is formed in the well 114. A top surface 119 of the doping region 118 is leveled with a top surface 104 of the substrate 102, whereby a base contact (not shown) can be formed in contact with the top surface 119 of the doping region 118.

In some embodiments, the base region 110 surrounds the collector region 120. The wells 114 and 116 abut opposite sides of the well 122. The buried layer 112 is formed under the wells 114, 122 and 116, and is connected to the wells 114 and 116. A pn junction 115 is formed between the well 114 and the well 122. A pn junction 125 is formed between the well 122 and the well 116.

In some embodiments, the doping region 124 is formed in the well region 122. A top surface 128 of the doping region 124 is leveled with the top surface 104 of the substrate 102, whereby a collector contact (not shown) can be formed in contact with the top surface 128 of the doping region 124. Other collector regions with different sub-regions such as a collector region including a portion of an original portion of the substrate 102, a well formed in the portion of the substrate and a doping region formed in the well that are of the same conductivity type are within the contemplated scope of the present disclosure.

In some embodiments, the emitter region 130 is a doping region 132. The doping region 132 is formed in the well 116. A top surface 136 of the doping region 132 is leveled with the top surface 104 of the substrate 102, whereby an emitter contact (not shown) can be formed in contact with the top surface 136 of the doping region 134. Other emitter regions with different sub-regions such as an emitter region including a well and a doping region formed in the well that are of the same conductivity type are within the contemplated scope of the present disclosure.

In some embodiments, the STI 142 is interposed between the doping regions 118 and 124, and thereby separating the doping regions 118 and 124. The STI 144 is interposed between the doping regions 124 and 132 and thereby separating the doping regions 124 and 132. The pn junction 125 is formed under the STI 144.

In some embodiments, the field plate 152 is formed over the STI 144 and is over the pn junction 125. Further, in some embodiments, the field plate 152 overlaps with a portion of the STI 144. A width $W_{152}$ of the field plate 152 substantially spans a distance $D_{100A}$ between closer substantial end lines 127 and 135 of corresponding bottoms 126 and 134 of the corresponding doping regions 124 and 132 to the junction 125. Other widths of the field plate and other number of field plates within the distance $D_{100A}$ are within the contemplated scope of the present disclosure.

In some embodiments, each of the bottoms 126 and 134 of the corresponding doping regions 124 and 132 is a boundary of the doping region 124 or doping region 132 of which tangential surfaces having an included angle with a normal surface from 90 degrees to 0 degree. The normal surface is located where a tangential surface of the boundary is in parallel with the top surface 104. Other ways to define each of the bottoms 126 and 134 such as depths of a boundary of the doping region 124 or doping 132 with respect to the surface 104 being within a percentage such as 85%, 90%, 95%, etc. of the largest depth of the boundary with respect to the surface 104 are within the contemplated scope of the present disclosure. The largest depth corresponds to where a tangential surface of the boundary is in parallel with the surface 104.

In some embodiments, each of substantial end lines 127 and 135 of corresponding bottoms 126 and 134 of the corresponding doping regions 124 and 132 is located where a tangential surface corresponds to a line within a portion of the bottom 126 or 134 overlapping with a top surface 146 of the STI 144 and has an included angle with the normal surface. The included angle has a difference with the smallest included angle within the portion of the bottom 126 or 134 within a percentage such as 5%, 10% and 15%, etc. of a difference between the largest included angle which is within the portion of the bottom 126 or 134 and the smallest included angel within the portion of the bottom 126 or 134. Other ways to define each of the substantial end lines 127 and 135 are within the contemplated scope of the present disclosure. For example, each of the substantial end lines 127 and 135 is located where a depth corresponds to a line within a portion of the bottom 126 or 134 overlapping with a top surface 146 of the STI 144. The depth has a difference with the smallest depth within the portion of the bottom 126 or 134 which is within a percentage such as 5%, 10% and 15%, etc. of a difference between the largest depth within the portion of the bottom 126 or 134 and the smallest included angel within the portion of the bottom 126 or 134.

In some embodiments, when a first distance substantially spans a second distance, the first distance overlaps with the second distance by a factor larger than a percentage such as 85%, 90%, 95%, etc. Other ways to define the first distance spanning the second distance are within the contemplated scope of the present disclosure. For example, a percentage difference between the second distance and the first distance is within, for example, 5%, 10%, 15%, etc.

In other embodiments, a width $W_{100A}$ of the field plate 152 substantially spans a distance $D_{100A}$ between substantially the closest lines of the closer lateral sides 147 and 148 of the corresponding doping regions 124 and 132 to the junction 125. The lateral sides 147 and 148 of the corresponding doping regions 124 and 132 coincide with lateral sides of the STI 144. The STI 144 is downward tapered. In other words, the STI 144 is wider toward the top surface 104 of the substrate 102. The closest lines of the closer lateral sides 147 and 148 of the corresponding doping regions 124 and 132 to the junction 125 are located farthest downward from the top surface 146 of the STI 144. Other embodiments in which lateral sides of the corresponding doping regions similar to the doping regions 124 and 132 coincide with lateral sides and a portion of a bottom of the STI 144 are within the contemplated scope of the present disclosure.

In some embodiments, the term "substantially the closest lines" refers to the lines corresponding to a percentage difference between a first distance between the lines and the second distance between the closest lines being within, for example, 5%, 10%, 15%, etc. Other ways to define the term "substantially the closest lines" are within the contemplated scope of the present disclosure. For example, the lines corresponding to a ratio of a first distance between the lines and the second distance between the closest lines being smaller than, for example, 105%, 110%, 115%, etc.

In some embodiments, the distance $D_{100A}$ is determined by a breakdown voltage value $BV_{WFP}$ between the emitter doping region 132 and the collector doping region 124 under an effect of the field plate 152. In some embodiments, the breakdown voltage value $BV_{WFP}$ between the emitter doping region 132 and the collector doping region 124 is a voltage value of a voltage applied to the emitter contact (not shown) in contact with the emitter doping region 132 and the collector contact (not shown) in contact with the collector doping region 124. The breakdown voltage value $BV_{WFP}$ results in breakdown of the pn junction 125. The distance $D_{100A}$ results in a trigger voltage value $Vtl_{WFP}$ and an on-state resistance $R_{WFP}$ of the BJT structure 100A. The breakdown voltage value $BV_{WFP}$, the trigger voltage value $Vtl_{WFP}$ and the on-state resistance $R_{WFP}$ are to be described with reference to FIG. 2.

Figure 1B:
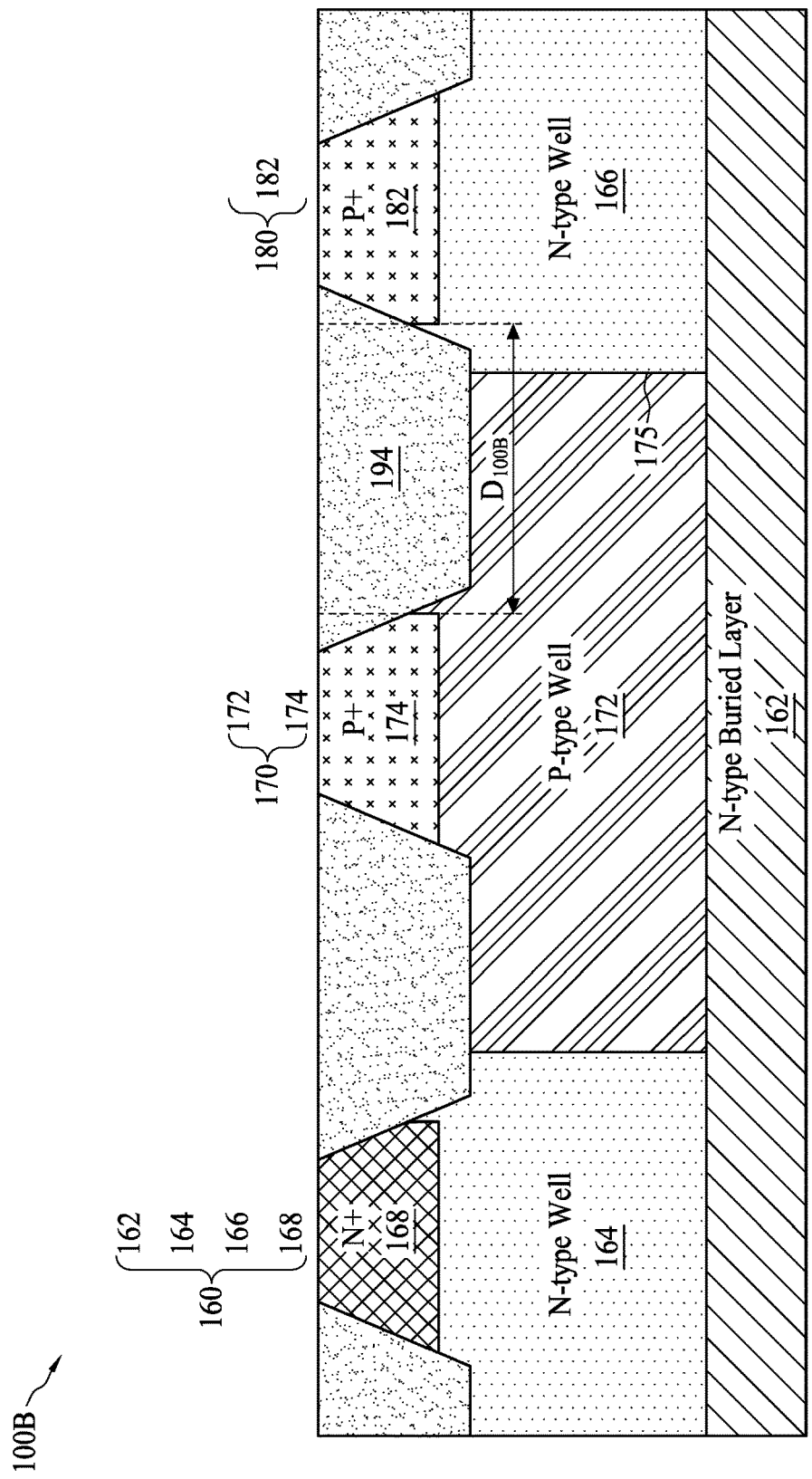
FIG. 1B is a schematic cross-sectional diagram of a BJT structure formed without a field plate over an STI between a collector doping region and an emitter doping region and serving as an ESD clamp, in other approaches.

FIG. 1B is a schematic cross-sectional diagram of a BJT structure 100B formed without a field plate 152 over an STI 194 between a collector doping region 124 and an emitter doping region 182 and serving as an ESD clamp, in other approaches. Compared to the BJT structure 100A in FIG. 1A, the BJT structure 100B does not have a field plate over the STI 194 between the collector doping region 174 and the emitter doping region 182. Compared to the distance $D_{100A}$ of the BJT structure 100A, a distance $D_{100B}$ between the collector doping region 174 and the emitter doping region 182 is larger. The distance $D_{100B}$ results in a breakdown voltage value $BV_{WOFP}$ of a pn junction 175.

Similar to the base region 110 of the BJT structure 100A, a base region 160 of the BJT structure 100B includes a buried layer 162, wells 164 and 166, and a doping region 168. Similar to the collector region 120 of the BJT structure 100A, a collector region 170 includes a well region 172 and a doping region 174. Similar to the emitter region 180 of the BJT structure 100A, an emitter region 180 includes a doping region 182. Similar to the STI 144 of the BJT structure 100A, an STI structure 194 is interposed between the doping regions 174 and 182. Similar to the pn junction 125 of the BJT structure 100A, a pn junction 175 is formed between the well 172 and the well 166. Similar to the distance $D_{100A}$ in the BJT structure 100A, a distance $D_{100B}$ is defined between closer substantial end lines (corresponding to the end lines 127 and 135) of corresponding bottoms (corresponding to the bottoms 126 and 134) of the corresponding doping region 174 and 182 to the STI 194.

Compared to the BJT structure 100A, the BJT structure 100B does not have the field plate 152 over the STI 194. Compared to the distance $D_{100A}$, the distance $D_{100B}$ is larger. Compared to the buried layer 112, the wells 114 and 116 and the doping region 118 of the base region 110, the corresponding buried layer 162, wells 164 and 166 and doping region 168 surround a larger collector region 170 due to the larger distance $D_{100B}$. Compared to the well region 122 and the doping region 124 of the collector region 120 and the doping region 132 of the emitter region 130, at least one of the doping region 174 and the doping region 182 may be further away from the pn junction 175 due to the larger distance $D_{100B}$. Compared to the STI 144 of the BJT structure 100A, the STI 194 is wider due to the larger distance $D_{100B}$.

In other approaches, the distance $D_{100B}$ is determined by a breakdown voltage value $BV_{WOFP}$ between the emitter doping region 182 and the collector doping region 174 without under the effect of the field plate 152. The breakdown voltage value $BV_{WOFP}$ results in breakdown of the pn junction 175. The distance $D_{100B}$ results in a trigger voltage value $Vtl_{WOFP}$ and an on-state resistance $R_{WOFP}$ of the BJT structure 100B. The breakdown voltage value $BV_{WOFP}$, the trigger voltage value $Vtl_{WOFP}$ and the on-state resistance $R_{WOFP}$ are to be described with reference to FIG. 2.

Figure 2:
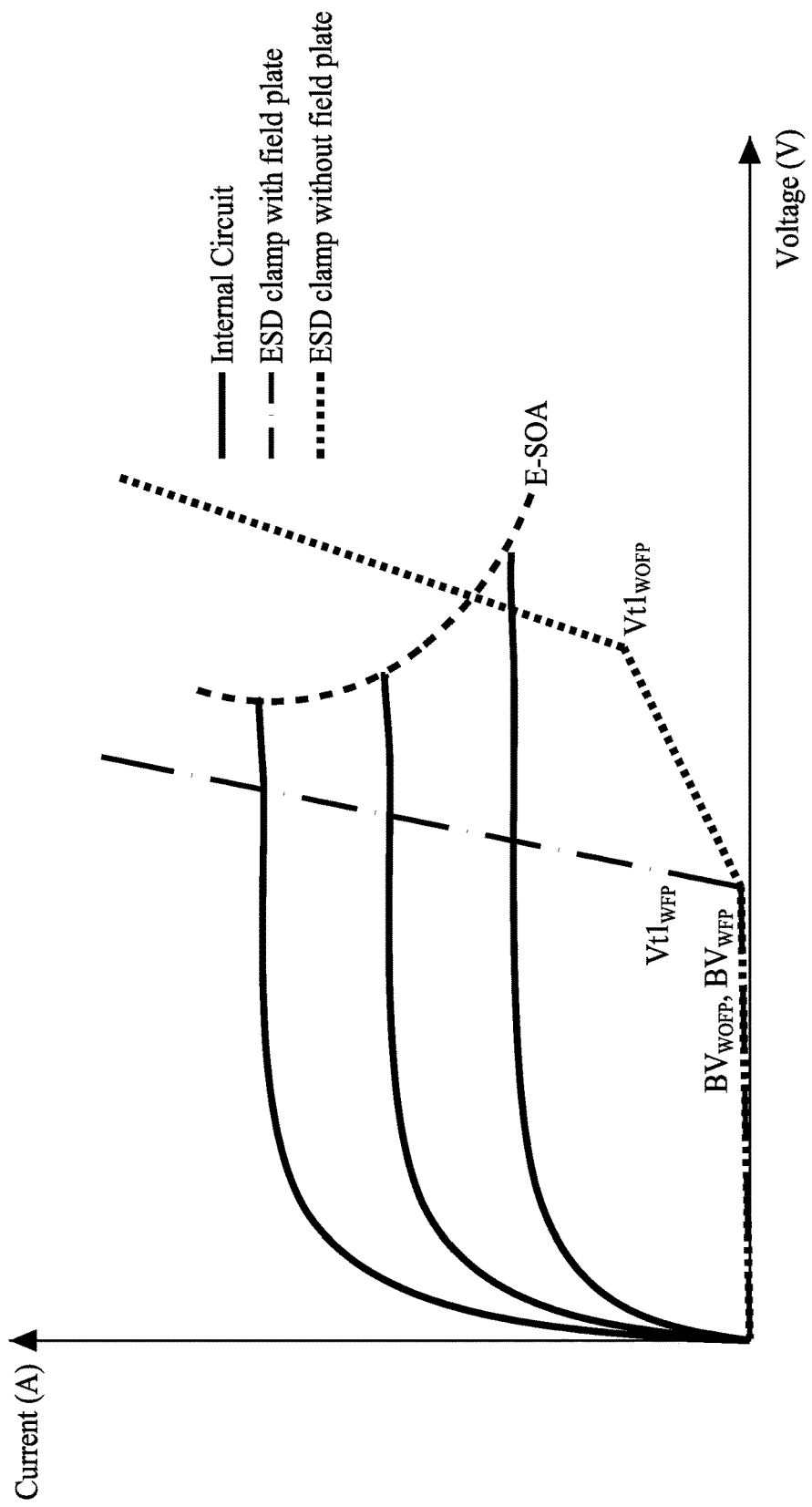
FIG. 2 is a diagram of TLP I-V curves of an internal circuit bounded by e-SOA and the ESD clamps with and without the field plate, in accordance with some embodiments.

FIG. 2 is a diagram of TLP I-V curves of an internal circuit bounded by e-SOA and the ESD clamps with and without the field plate, in accordance with some embodiments. The breakdown voltage value $BV_{WFP}$ of the WIT structure 100A formed with the field plate 152 and having the shorter distance $D_{100A}$ as shown in FIG. 1A is substantially the same as the breakdown voltage value $BV_{WOFP}$ of the BJT structure 100B formed without the field plate 152 and having the larger distance $D_{100B}$ as shown in FIG. 1B. Further, the shorter distance $D_{100A}$ results in the smaller trigger voltage value $Vtl_{WFP}$, and the smaller on-state resistance $R_{WFP}$, and the larger distance $D_{100B}$ results in the larger trigger voltage value $Vtl_{WOFP}$ and the larger on-state resistance $R_{WOFP}$. The smaller trigger voltage value $Vtl_{WFP}$ speeds up the ESD protection capability. The smaller on-state resistance $R_{WFP}$ causes a larger portion of the electrical-safe operating area (e-SOA) of the internal circuit to fall on a right side of the I-V curve of the ESD clamp with the field plate 152 compared to the I-V curve of the ESD clamp without the field plate.

The internal circuit may, for example, be a power field effect transistor (FET). The e-SOA is measured by, for example, applying 100 ns transmission line pulses (TLPs) to a drain of the internal circuit under different DC gate to source voltage values of the internal circuit. For the internal circuit, the horizontal axis in the FIG. 2 represents a drain to source voltage and the vertical axis in FIG. 2 represents a drain to source current. The different I-V curves of the internal circuit correspond to different gate to source voltage values. As the gate to source values increase, the on-state current values of the I-V curves of the internal circuit also increase. The e-SOA is defined by points in the I-V curves of the internal circuit which correspond to breakdown and/or catastrophic destruction of the internal circuit. As shown in FIG. 2, as the gate to source voltage values increase, the e-SOA is pushed leftward to smaller drain to source voltage values.

Each of the BIT structure 100A and BJT structure 100B serves as an ESD clamp for an ESD current resulting from a large ESD pulse applied to the drain of the internal circuit to flow therethrough. The I-V curve for the ESD clamp with field plate 152 is measured from applying, for example, 100 ns TLPs to the BJT structure 100A. The I-V curve for the ESD clamp without the field plate 152 is measured from applying, for example, 100 ns TLPs to the BJT structure 100B. For the BJT structures 100A and 100B which are PNP ESD clamps, the horizontal axis in FIG. 2 represents an emitter to collector voltage and the vertical axis in FIG. 2 represents an emitter to collector current.

As shown by the I-V curve for the ESD clamp without the field plate 152, when an ESD pulse is applied to the emitter doping region 182 of the BJT structure 100B, the breakdown voltage value $BV_{WOFP}$ between the emitter doping region 182 and the collector doping region 174 causes avalanche breakdown of the pn junction 175 which generates free electron and hole pairs. When the distance $D_{100B}$ is larger, a higher breakdown voltage value is needed to cause breakdown at the pn junction 175. As the emitter to collector voltage keeps increasing, free electrons flow to the doping region 168, thereby forward biasing the emitter region 180 and the base region 160. At the trigger voltage value $Vtl_{WOFP}$, the PNP ESD clamp implemented by the BJT structure 100B is turned on. After the trigger voltage value $Vtl_{WOFP}$, a slope of the I-V curve for the ESD clamp without field plate increases, which corresponds to a smaller on-state resistance $R_{WOFP}$ through which the ESD current is discharged. When the distance $D_{100B}$ is larger, the PNP ESD clamp implemented by the BJT structure 100B is turned on by a higher trigger voltage $Vtl_{WOFP}$ due to the free electrons having to travel a longer distance from the pn junction 175 to the doping region 168. In addition, the PNP ESD clamp implemented by the BJT structure 100B has a higher on-state resistance $R_{WOFP}$ due to free holes having to travel a longer distance from the emitter doping region 182 to the collector doping region 174.

Compared to the I-V curve for the ESD clamp without the field plate 152, the I-V curve for the ESD clamp with the field plate 152 has substantially the same breakdown voltage $BV_{WFP}$ as the breakdown voltage value $BV_{WOFP}$. In some embodiments, by adding a field plate 152 in the BJT structure 100A, and applying a positive voltage to the field plate 152 substantially the same as that to the emitter contact in contact with the emitter doping region 132, a width of a depletion region at the pn junction 125 is widened, thereby causing the pn junction 125 to breakdown at substantially the same breakdown voltage value $BV_{WFP}$ as the breakdown voltage value $BV_{WOFP}$ even though the distance $D_{100A}$ is shorter than the distance $D_{100B}$. In addition, by having the width $W_{152}$ of the field plate 152 to span the distance $D_{100A}$, the width of the depletion region at the pn junction 125 which vary with an applied voltage across the emitter doping region 132 and the collector doping region 124 and an applied voltage to the field plate 152 is made within the width $W_{152}$ of the field plate 152. The shorter distance $D_{100A}$ results in a smaller area of the BJT structure 100A compared to the BJT structure 100B. Furthermore, the shorter distance $D_{100A}$ results in the lower trigger voltage value $Vtl_{WFP}$ compared to the trigger voltage value $Vtl_{WOFP}$ due to a shorter distance that the free electrons having to travel from the pn junction 125 to the doping region 118. The shorter distance $D_{100A}$ also results in the a higher slope after the trigger voltage value $Vtl_{WFP}$ compared to the slope after the trigger voltage value $Vtl_{WOFP}$ due to free holes having to travel a shorter distance from the emitter doping region 132 to the collector doping region 124. Therefore, the on-state resistance $R_{WFP}$ of the PNP ESD clamp implemented by the BJT structure 100A is smaller. Moreover, the smaller trigger voltage $Vtl_{WFP}$ and the smaller on-state resistance $R_{WFP}$ results in a larger portion of the e-SOA of the internal circuit to fall on a right side the I-V curve of the ESD clamp with the field plate 152 compared to the I-V curve of the ESD clamp without the field plate 152. For each of the portions of the e-SOA falling on the right sides of I-V curves of the corresponding ESD clamps with and without the field plate 152, the ESD current is safely discharged through the ESD clamp and the drain to source voltage is clamped by the ESD clamps, and breakdown and damage of the internal circuit is prevented.

In some embodiments, the BJT structure 100A is the PNP ESD clamp. Compared to an NPN ESD clamp, the PNP ESD clamp has a higher holding voltage and therefore may be latch up free. Due to smaller mobility of holes, the on-state resistance $R_{WFP}$ of the PNP ESI) damp is larger than an on-state resistance of an NPN ESD damp. By decreasing the distance $D_{100A}$ in the WIT structure 100A, the on-state resistance $R_{WFP}$ is substantially decreased.

In some embodiments, the breakdown voltage value $BV_{WFP}$ of the BJT structure 100A is designed to be substantially the same as the breakdown voltage value $BV_{WOFP}$ of the BJT structure 100B. The breakdown voltage value $BV_{WOFP}$ may be determined based on a design specification. Other ways to design the breakdown voltage value $BV_{WFP}$ of the BJT structure 100A such as being greater than the breakdown voltage value $BV_{WOFP}$ of the BJT structure 100B are within the contemplated scope of the present disclosure.

In some embodiments, the term "substantially the same" for a first value and a second value refers to a ratio of the first value to the second value being larger than, for example, 85%, 90%, 95%, etc. and smaller than, for example, 105%, 110%, 115%, etc. Other ways to define a first value being substantially the same as the second value are within the contemplated scope of the present disclosure. For example, an absolute percentage difference between the first value and the second value is smaller than, for example, 5%, 10%, 15%, etc.

Figure 3:
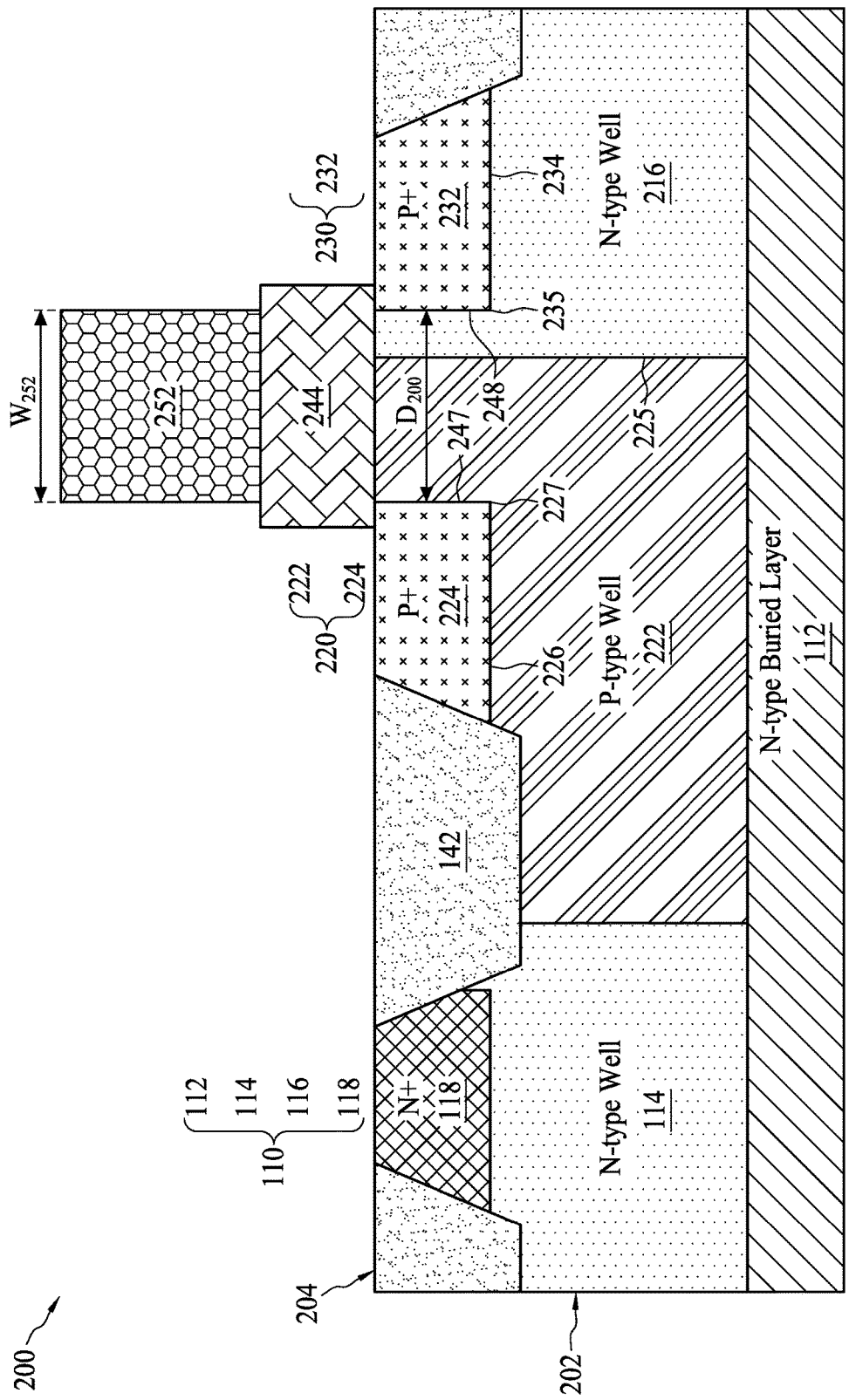
FIG. 3 is a schematic cross-sectional diagram of a BJT structure formed with a field plate over a silicide blocking structure above and partially between a collector doping region and an emitter doping region and serving as an ESD clamp, in accordance with some embodiments.

FIG. 3 is a schematic cross-sectional diagram of a BJT structure 200 formed with a field plate 252 over a silicide blocking structure 244 above and a portion of which is between a collector doping region 224 and an emitter doping region 232 and serving as an ESD clamp, in accordance with some embodiments. Compared to the BJT structure 100A in FIG. 1A, the field plate 252 is formed over the silicide blocking structure 244 above and a portion of which is between the collector doping region 224 and the emitter doping region 232.

In some embodiments, a bipolar junction transistor (BJT) structure 200 is implemented in a BCD process. The BJT structure 200 implemented in other processes such as an extended voltage CMOS process, a BiCMOS process, a BJT process, etc. are within the contemplated scope of the present disclosure.

Compared to the substrate 102 of the BJT structure 100A, the substrate 202 includes a base region 110, a collector region 220, an emitter region 230 and the STI 142 but not the STI 144. The substrate 202 has a top surface 204. Compared to the collector region 120 of the BJT structure 100A, the collector region 220 includes a well 222 and a doping region 224. Compared to the emitter region 130 of the BJT structure 100A, the emitter region 230 includes a doping region 232. A pn junction 225 is formed between the well 222 and the well 216. Compared to the pn junction 125 formed between the well 122 and the well 116 in the BJT structure 100A, the pn junction 225 has a larger interface between the well 222 and the well 216. Compared to the doping regions 124 and 132 of the BJT structure 100A, the doping regions 224 and 232 do not have the STI 144 interposed therebetween and therefore have corresponding bottoms 226 and 234 which do not overlap with the top surface of 146 of the STI 144 and corresponding lateral sides 247 and 248 which do not abut with the STI 144.

In some embodiments, an insulating structure over which the field plate 252 is formed is a silicide blocking structure 244. The silicide blocking structure 244 is formed above and a portion of which is between the collector doping region 224 and the emitter doping region 232. That is, the silicide blocking structure 244 is formed above and overlapping a portion of the substrate 202 between the collector doping region 224 and the emitter doping region 232. When the STI 144 (shown in FIG. 1A) is not formed between the doping regions 224 and 232, the silicide blocking structure 244 is used to prevent silicide formed on top surfaces other than those of STIs such as an STI 142 from shorting the doping region 224 and the doping region 232. Exemplary materials of the silicide blocking structure 244 include oxide and nitride.

In some embodiments, the field plate 252 is formed over the silicide blocking structure 242. In some embodiments, the field plate 252 overlaps with a portion of the silicide blocking structure 244. A width $W_{252}$ of the field plate 252 substantially spans a distance $D_{200}$ between closer substantial end lines 227 and 235 of corresponding bottoms 226 and 234 of the corresponding doping region 224 and doping region 232 to the junction 225.

Compared to the substantial end lines 127 and 135 of the corresponding bottoms 126 and 134 of the corresponding doping region 124 and 132 of the BJT structure 100A, the substantial end lines 227 and 235 are not defined with respect to the STI 144. Each of the substantial end lines 227 and 235 is located where a tangential surface of the bottom 226 or 234 has an included angle with a normal surface at which a tangential surface of the bottom 226 or 234 is in parallel with the top surface 204. The included angle is within a percentage difference such as 5%, 10% and 15%, etc. of the smallest included angle within the bottom 226 or 234. Other ways to define each of the substantial end lines 227 and 235 are within the contemplated scope of the present disclosure. For example, each of the substantial end lines 227 and 235 is located where a depth corresponds to a line within the bottom 226 or 234. The depth is within a percentage difference such as 5%, 10% and 15%, etc. of the smallest depth within the bottom 227 or 235.

In other embodiments, a width $W_{252}$ of the field plate 252 substantially spans a distance $D_{200}$ between substantially the closest lines of the corresponding closer lateral sides 247 and 248 of the corresponding doping regions 224 and 232 to the junction 225. In some embodiments, the doping regions 224 and 232 are tapered downward. Without the STI 144, the closest lines of the corresponding closer lateral sides 247 and 248 of the corresponding doping regions 224 and 232 are located at the top surface 204. In other embodiments, the doping regions 224 and 232 tapers upward before tapers downward. Without the STI 144, the closest lines of the corresponding closer lateral sides 247 and 248 of the corresponding doping regions 224 and 232 are located where the doping regions 224 and 232 transition from tapering upward to tapering downward.

Figure 4:
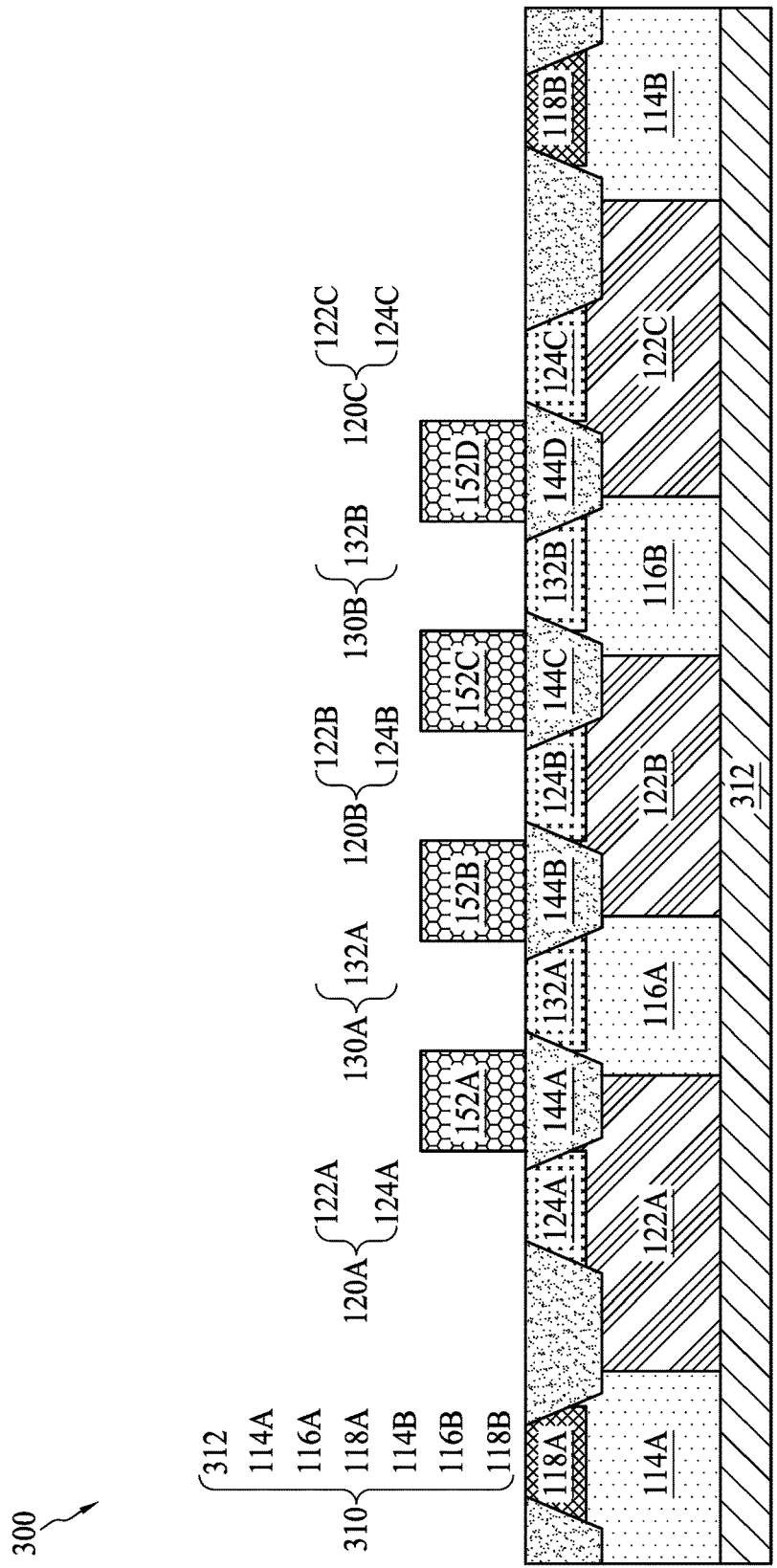
FIG. 4 is a schematic cross-sectional diagram of a multi-finger BJT structure formed with field plates between corresponding collector and emitter doping region pairs, in accordance with some embodiments.

Multi-Finger BJT Structure with Field Plates Formed between Corresponding Collector and Emitter Doping Region Pairs FIG. 4 is a schematic cross-sectional diagram of a multi-finger BJT structure 300 formed with field plates 152A to 152D between corresponding collector and emitter doping region pairs 124A and 132A, 132A and 124B, 124B and 132B, and 132B and 124C, in accordance with some embodiments. Similar to the BJT structure 100A in 1A, the multi-finger BJT structure 300 includes the collector and emitter doping region pair 124A and 132A and a field plate 152A, which are similar to the corresponding collector doping region 124, emitter doping region 132 and field plate 152, and has the distance $D_{100A}$ between the collector doping region 124A and the emitter doping region 132A. Compared to the BJT structure 100A, the multi-finger BJT structure 300 further includes a collector and emitter doping region pair 124B and 132A and a field plate 152B, a collector and emitter doping region pair 124B and 132B and a field plate 152C, and a collector and emitter doping region pair 124C and 132B and a field plate 152D, each of which is similar to the corresponding collector and emitter doping region pair 124A and 132A and field plate 152A.

In some embodiments, a multi-finger BJT structure 300 includes a base region 310, a plurality of collector regions 120A to 120C, a plurality of emitter regions 130A to 130B, a plurality of STIs 144A to 144D and a plurality of field plates 152A to 152D. Similar to the base region 110 of the BJT structure 100A, the base region 310 includes a portion of a buried layer 312, wells 114A and 116A and a doping region 118A corresponding to the corresponding buried layer 112, wells 114 and 116 and doping region 118. Similar to the collector region 120 of the BJT structure 100A, the collector region 120A includes a well 122A and a doping region 124A corresponding to the corresponding well 122 and doping region 124. Similar to the emitter region 130 of the BJT structure 100A, the emitter region 130A includes a doping region 132A corresponding to the doping region 132. The portion of the buried layer 312 is formed under the wells 114A, 122A and 116A and connected to the wells 114A and 116A.

Compared to the base region 110 of the BJT structure 100A, the base region 310 further includes another portion of the buried layer 312, wells 116B, 114B and a doping region 118B. The doping region 118B is formed in the well 114B. The base region 310 surrounds each of the collector regions 122B and 122C. The wells 116A and 161B abut opposite sides of the well 122B. The wells 116B and 114B abut opposite sides of the well 122C. The other portion of the buried layer 312 is formed under the wells 122B, 116B, 122C and 114B and connected to the wells 116B and 114B. The emitter region 132B is formed in the well 116B. Therefore, the base region 310 surrounds the collector region 120A, the emitter region 130A, the collector region 120B, the emitter region 130B and the collector region 120C with the wells 114A and 114B and the buried layer 312.

In some embodiments, the collector region 120B, the emitter region 130A, the well 116A of the base region 310, the STI 144B and the field plate 152B forms a substantially symmetrical structure of the collector region 120A, the emitter region 130A, the well 116A of the base region 310, the STI 144A and the field plate 152A with respect to the well 116A. The collector region 120B, the emitter region 130B, the well 116B of the base region 310, the STI 144C and the field plate 152C forms a substantially the same structure of the collector region 120A, the emitter region 130A, the well 116A of the base region 310, the STI 144A and the field plate 152A. The collector region 120C, the emitter region 130B, the well 116B of the base region 310, the STI 144D and the field plate 152D forms a substantially symmetrical structure of the collector region 120A, the emitter region 130A, the well 116A of the base region 310, the STI 144A and the field plate 152A with respect to the well 116A.

Therefore, a corresponding distance between each of the collector and emitter doping region pairs 124A and 132A, 124B and 132A, 124B and 132B and 124C and 132B is substantially the same as the distance $D_{100A}$ of the BJT structure 100A. The collector and emitter doping region pairs 124A and 132A, 124B and 132A, 124B and 132B, and 124C and 132B are the multiple fingers. A total difference between the distances (each of which is substantially equal to the distance $D_{100B}$) of a multi-finger BJT structure (not shown) without the field plates 152A to 152D and the distances (each of which is substantially equal to the distance $D_{100A}$) of the multi-finger BJT structure 300 is equal to $(D_{100B}-D_{100A}) \times$ number of fingers. The number of fingers in the example in FIG. 4 is equal to 4. Therefore, an area of the multi-finger BJT structure 300 with the field plates 152A to 152D is significantly smaller than an area of the multi-finger BJT structure without the field plates 152A to 152D.

In some embodiments, each of the terms "substantially the same structure" and "substantially symmetrical structure" refers to a first structure which is correspondingly similarly arranged or inversely arranged as the second structure, and has substantially the same characteristic values such as a distance between a collector doping region and emitter doping region, and a breakdown voltage of a pn junction between the collector region and the base region as a second structure.

In some embodiments, when a first structure is referred to as "another" structure of a second structure, the first structure may form a substantially the same structure or substantially symmetrical structure as the second structure. Further modifications can be performed on the first structure to result in a third structure which is based on the second structure but different from the second structure or a symmetrical structure of the second structure.

In some embodiments, the multi-finger BJT structure 300 is based on the BJT structure 100A in FIG. 1A. Other multi-finger BJT structures such as a multi-finger BJT structure based on a BJT structure 200 in FIG. 3 are within the contemplated scope of the present disclosure.

Figure 5:
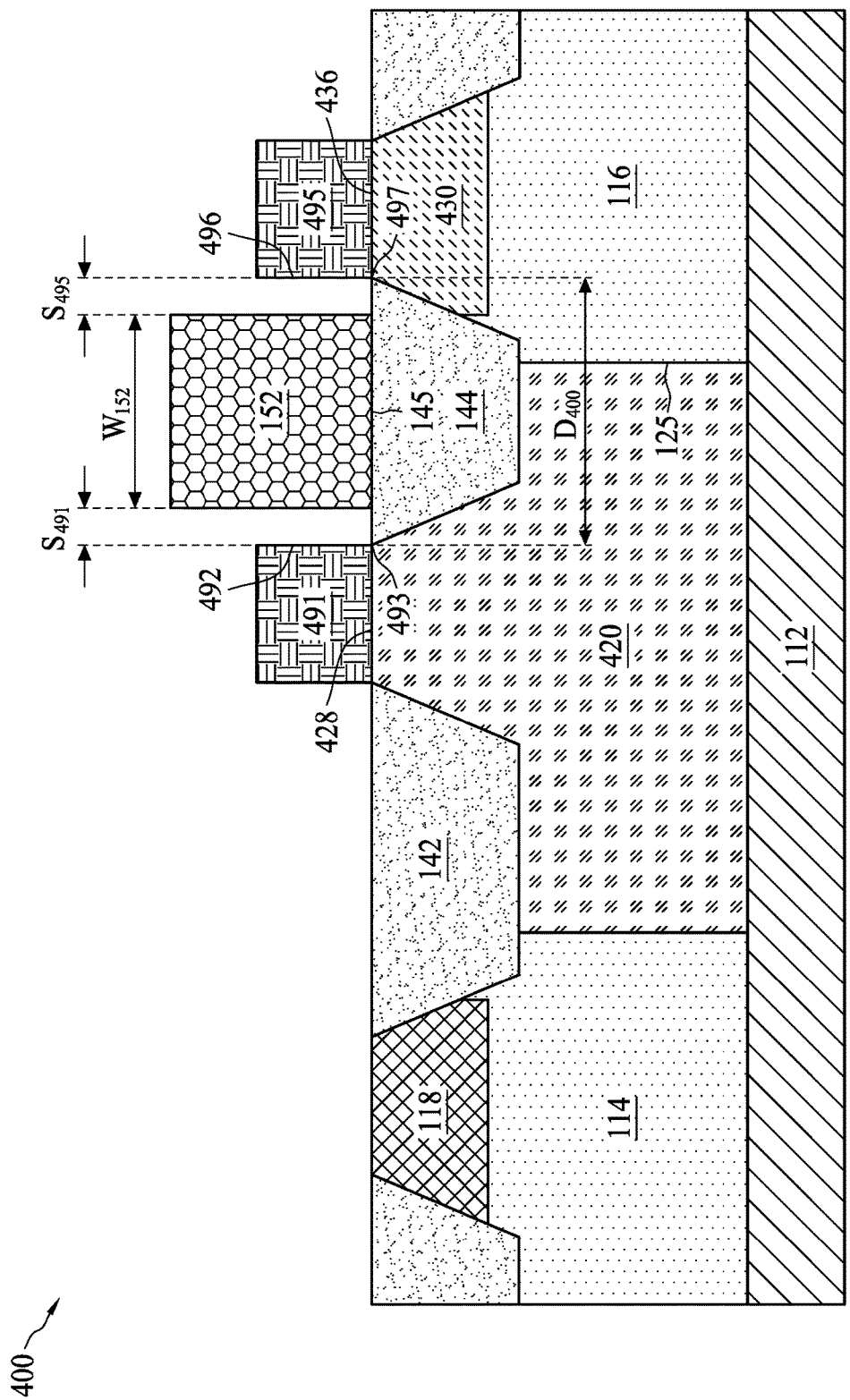
FIG. 5 is a schematic cross-sectional diagram of a BJT structure formed with a field plate over an STI below and between a collector contact and an emitter contact and serving as an ESD clamp, in accordance with some embodiments.

BJT Structure with Field Plate Formed between Collector Contacts and Emitter Contacts and with Base Region Surrounding Collector Region FIG. 5 is a schematic cross-sectional diagram of a BJT structure 400 formed with a field plate 152 over an STI 144 below and between a collector contact 491 and an emitter contact 495 and serving as an ESD clamp, in accordance with some embodiments. Compared to the BJT structure 100A in FIG. 1A, the field plate 152 is formed over the STI 144 below and between the collector contact 491 and emitter contact 495. Moreover, the collector contact 491 and the emitter contact 495 are separated from each other by a distance $D_{400}$. The field plate 152 and the distance $D_{400}$ result in breakdown of a pn junction 125 corresponding to a breakdown voltage value $BV_{WFP}$ between the emitter contact 495 and the collector contact 491.

In some embodiments, a bipolar junction transistor (BJT) structure 400 is implemented in a BCD process. The BJT structure 400 implemented in other processes such as an extended voltage CMOS process, a BiCMOS process, a BJT process, etc. are within the contemplated scope of the present disclosure.

Compared to the BJT structure 100A, the BJT structure 400 includes a collector region 420, a collector contact 491, an emitter region 430 and an emitter contact 495. In some embodiments, the collector contact 491 is formed in contact with a top surface 428 of the collector region 420. The emitter contact 495 is formed in contact with a top surface 436 of the emitter region 430. The collector region 420 may include a doping region and a well which are similar to the corresponding doping region 124 and well 122 of the BJT structure 100A. Other collector regions with different sub-regions such as a collector region which is a substantially uniform doping region, a collector region including an original portion of a substrate, a well formed in the substrate and a doping region formed in the well are within the contemplated scope of the present disclosure. The emitter region 430 may be a doping region which is similar to the doping region 132 of the BJT structure 100A. Other emitter regions with different sub-regions such as an emitter region which includes a well, and a doping region formed in the well are within the contemplated scope of the present disclosure.

Compared to the distance $D_{100A}$ of the BJT structure 100A, a distance $D_{400}$ is defined between lines 493 and 497 of corresponding closer lateral sides 492 and 496 of the corresponding collector contact 491 and emitter contact 495 to the junction 125. In some embodiments, the lines 493 and 497 are located at the top surface 428 of the collector region 420 and at the top surface 436 of the emitter region 430.

In some embodiments, the STI 144 is formed below and between the collector contact 491 and the emitter contact 495. The STI 144 is downward tapered. A width of the top surface 145 of the STI 144 is defined as the distance $D_{400}$.

Compared to the distance $D_{100A}$, the distance $D_{400}$ is determined by a breakdown voltage value $BV_{WFP}$ between the emitter contact 494 and the collector contact 491. The distance $D_{400}$ results in a trigger voltage value $VTl_{WFP}$ and an on-state resistance $R_{WFP}$ of the BJT structure 400. The breakdown voltage value $BV_{WFP}$, the trigger voltage value $Vtl_{WFP}$ and the on-state resistance $R_{WFP}$ have been described with reference to FIG. 2.

Compared to the width $W_{152}$ of the field plate 152 of the BJT structure 100A which spans the distance $D_{100A}$, the width $W_{152}$ of the field plate 152 of the BJT structure 400 overlaps with a portion of the distance $D_{400}$ such that the field plate 152 has substantially minimum spacings $S_{491}$ and $S_{495}$ with the corresponding collector contact 491 and emitter contact 495. The minimum spacings $S_{491}$ and $S_{495}$ between the corresponding collector contact 491 and field plate 152, and emitter contact 495 and field plate 152 is similarly defined as, for example, a minimum spacing design rule between a contact and a gate structure.

Figure 6:
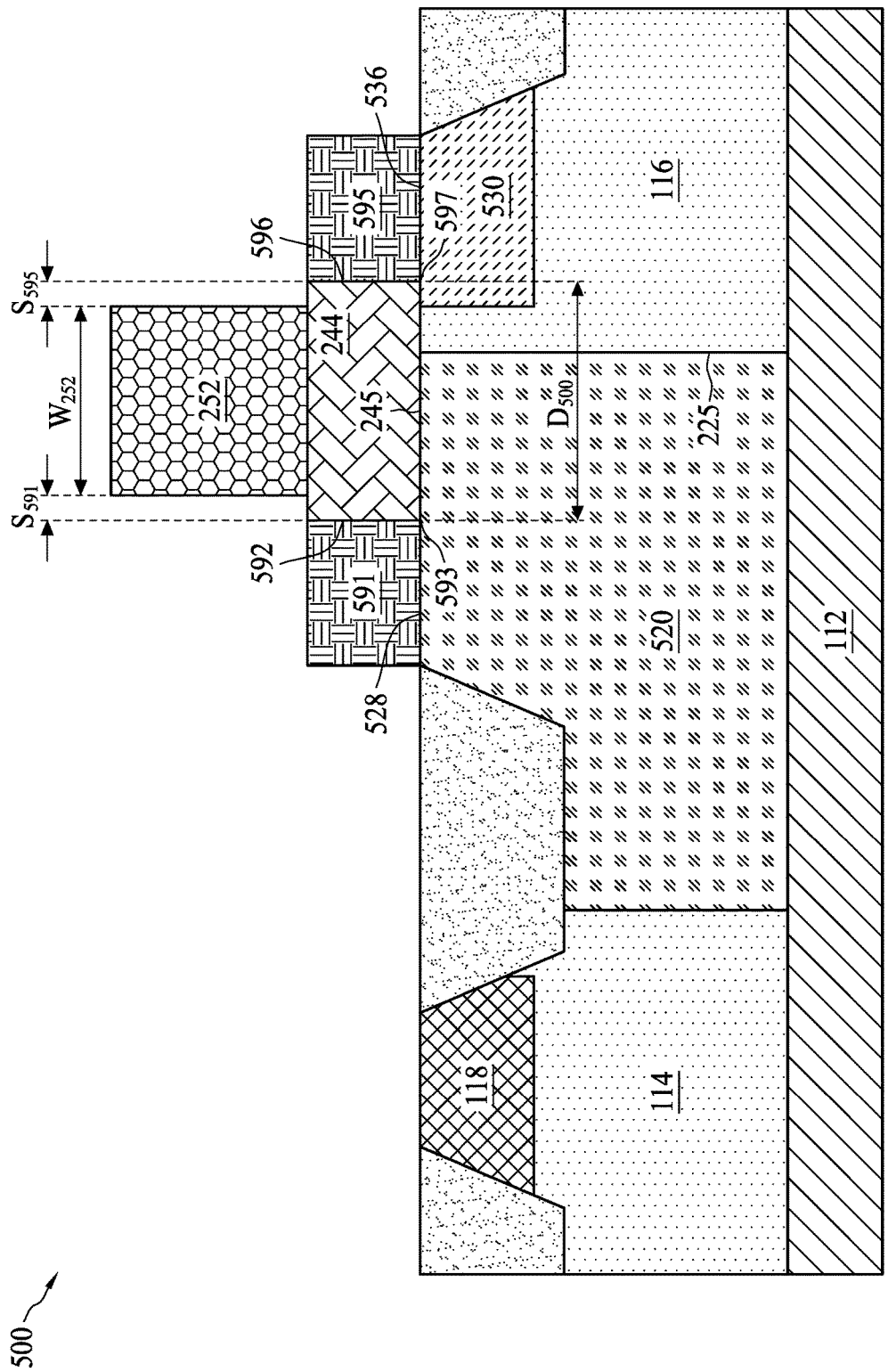
FIG. 6 is a schematic cross-sectional diagram of a BJT structure formed with a field plate over a silicide blocking structure interposed between a collector contact and an emitter contact and serving as an ESD clamp, in accordance with some embodiments.

FIG. 6 is a schematic cross-sectional diagram of a BJT structure 500 formed with a field plate 252 over a silicide blocking structure 244 interposed between a collector contact 591 and an emitter contact 595 and serving as an ESD clamp, in accordance with some embodiments. Compared to the BJT structure 200 in FIG. 3, the field plate 252 is formed over the silicide blocking structure 244 interposed between the collector contact 591 and an emitter contact 595 and a distance $D_{500}$ between the collector contact 591 and the emitter contact 595 results in breakdown of a pn junction 225 corresponding to a breakdown voltage value $BV_{WFP}$ between the emitter contact 595 and the collector contact 591.

In some embodiments, a bipolar junction transistor (BJT) structure 500 is implemented in a BCD process. The BJT structure 500 implemented in other processes such as an extended voltage CMOS process, a BiCMOS process, a BJT process, etc. are within the contemplated scope of the present disclosure.

Compared to the BJT structure 200, the BJT structure 500 includes a collector region 520, a collector contact 591, an emitter region 530 and an emitter contact 595. In some embodiments, the collector contact 591 is formed in contact with a top surface 528 of the collector region 520. The emitter contact 595 is formed in contact with a top surface 536 of the emitter region 530. The collector region 520 may include a doping region and a well which are similar to the corresponding doping region 224 and well 222. Other collector regions with different sub-regions such as a collector region which is a substantially uniform doping region, a collector region including an original portion of the substrate, a well formed in the substrate and a doping region formed in the well are within the contemplated scope of the present disclosure. The emitter region 530 may be a doping region which is similar to the doping region 232. Other emitter regions with different sub-regions such as an emitter region which includes a well, and a doping region formed in the well are within the contemplated scope of the present disclosure.

Compared to the distance $D_{200}$ of the BIT structure 500, a distance $D_{500}$ is defined between lines 593 and 597 of corresponding closer lateral sides 592 and 596 of the corresponding collector contact 591 and emitter contact 595 to the junction 225. In some embodiments, the lines 593 and 597 are located at the top surface 528 of the collector region 520 and at the top surface 536 of the emitter region 530. In some embodiments, the silicide blocking structure 244 is interposed between the collector contact 591 and the emitter contact 595. A width of the bottom surface 245 of the silicide blocking structure 244 is defined as the distance $D_{500}$.

Compared to the distance $D_{200}$, the distance $D_{500}$ is determined by a breakdown voltage value $BV_{WFP}$ between the emitter contact 595 and the collector contact 591. The distance $D_{500}$ results in a trigger voltage value $VTl_{WFP}$ and an on-state resistance $R_{WFP}$ of the BJT structure 500. The breakdown voltage value $BV_{WFP}$, the trigger voltage value $Vtl_{WFP}$ and the on-state resistance $R_{WFP}$ have been described with reference to FIG. 2.

Compared to the width $W_{252}$ of the field plate 252 of the BJT structure 200 which spans the distance $D_{200}$, the width $W_{252}$ of the field plate 252 of the BJT structure 500 overlaps with a portion of the distance $D_{500}$ such that the field plate 252 has substantially minimum spacings $S_{591}$ and $S_{595}$ with the corresponding collector contact 591 and emitter contact 595. The minimum spacings $S_{591}$ and $S_{595}$ between the corresponding collector contact 591 and field plate 252, and emitter contact 594 and field plate 252 is similarly defined as, for example, a minimum spacing design rule between a contact and a gate structure.

A multi-finger BJT structure (not shown) based on the BJT structure 400 or 500 and similar to the multi-finger BJT structure 300 in FIG. 4 is within the contemplated scope of the present disclosure. Compared to the multi-finger BJT structure 300 which has the field plates 152A to 152D and insulating structures 144A to 144D located within the distances defined between the corresponding collector and emitter doping region pairs 120A and 130A, 120B and 130A, 120B and 130B, and 120C and 130B, the multi-finger BJT structure based on the BJT structure 400 or 500 has the field plates and insulating structures located within distances defined between corresponding collector and emitter contact pairs. Each field plate, insulating structure and pair of collector and emitter contacts of the multi-finger BJT structure based on the BJT structure 400 or 500 are substantially the same as the corresponding field plate 152 or 252, insulating structure 144 or 244 and pair of collector and emitter contacts 491 and 495, or 591 and 595.

Figure 7:
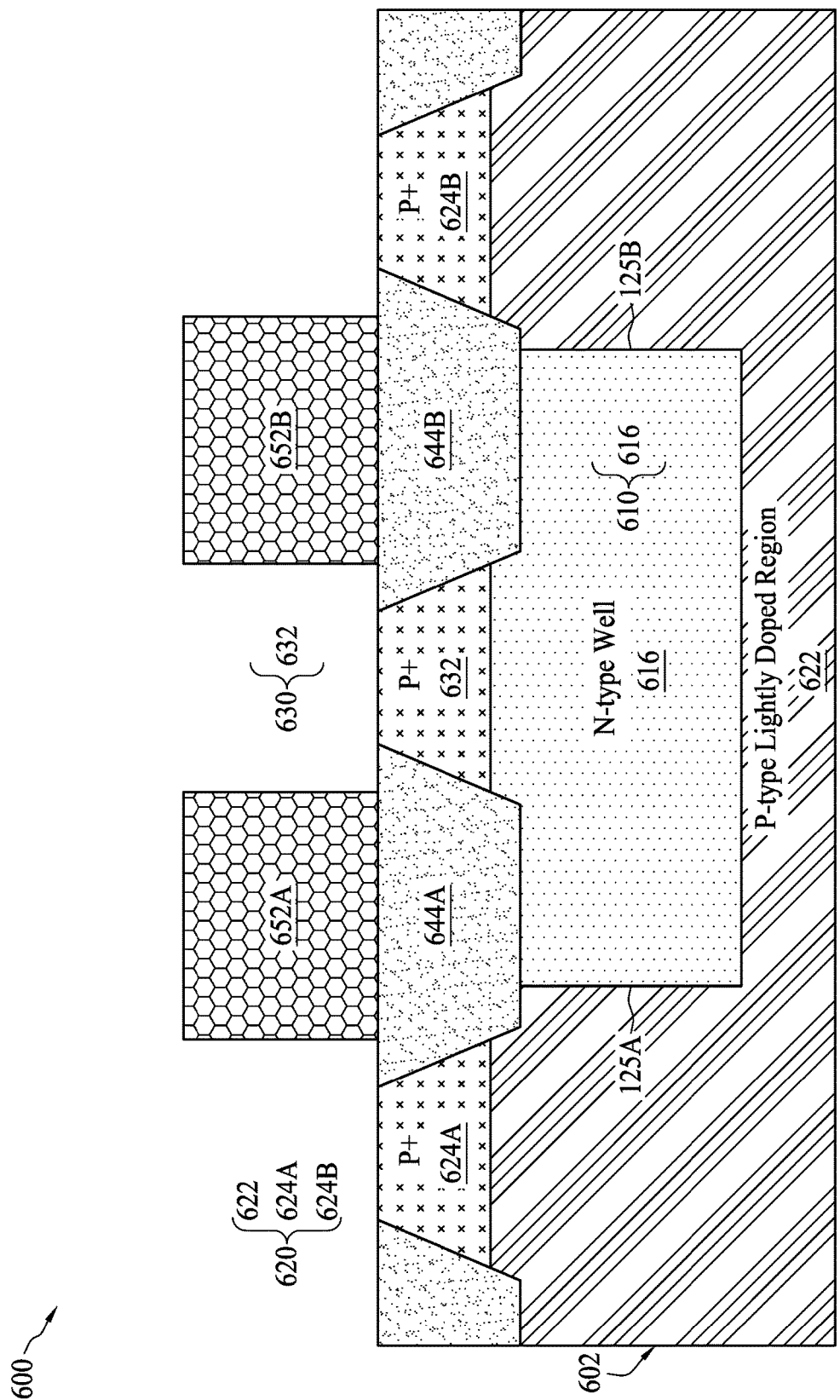
FIG. 7 is a schematic cross-sectional diagram of a BJT structure formed with field plates between an emitter doping region and corresponding collector doping regions in a collector region surrounding a base region, in accordance with some embodiments.

BJT Structure with Field Plate Formed between Collector Doping Region and Emitter Doping Region and with Collector Region Surrounding Base Region FIG. 7 is a schematic cross-sectional diagram of a BJT structure 600 formed with field plates 652A and 652B between an emitter doping region 632 and corresponding collector doping regions 624A and 624B in a collector region 620 surrounding a base region 610, in accordance with some embodiments. Compared to the BJT structure 100A which has the base region 110 surrounding the collector region 120, the BJT structure 600 has the collector region 620 surrounding the base region 610.

Compared to the WIT structure 100A in FIG. 1A, the BJT structure 600 includes a substrate 602 and field plates 652A and 652B over the substrate 602. Compared to the substrate 102 of the BJT structure 100A, the substrate 602 includes a base region 610, a collector region 620, an emitter region 630 and insulating structures which are STIs 644A and 644B. Compared to the collector region 120 of the BJT structure 100A, the collector region 620 includes a lightly doped region 622 and heavily doped regions 624A and 624B. Compared to the base region 110 of the BJT structure 100A, the base region 610 includes a well 616. Compared to the base region 110 which surrounds the collector region 120 in FIG. 1A, the collector region 620 surrounds the base region 610. The lightly doped region 622 abuts opposite sides of the well 616 and form corresponding pn junctions 125A and 125B. Compared to the emitter region 130 of the BJT structure 100A, the emitter region 630 includes a doping region 632.

In some embodiments, a portion of the lightly doped region 622 abutting a left side of the well 616, the doping region 624A, the well 616, the doping region 632, the STI 644A and the field plate 652A form substantially the same structure as the well 122, the doping region 124, the well 116, the doping region 132, the STI 144 and the field plate 152. In some embodiments, a portion of the lightly doped region 622 abutting a right side of the well 616, the doping region 624B, the well 616, the doping region 632, the STI 644B and the field plate 652B forms substantially symmetrical structure of the well 122, the doping region 124, the well 116, the doping region 132, the STI 144 and the field plate 152.

A multi-finger BJT structure (not shown) which includes a plurality of the BJT structures 600 is within the contemplated scope of the present disclosure. Each connected first BJT structure and second BJT structure in the plurality of BJT structures are connected by overlapping a first portion of the lightly doped region 622 abutting the pn junction 125B of the first BJT structure and a second portion of the lightly doped region 622 abutting the pn junction 125A of the second BJT structure.

Figure 8:
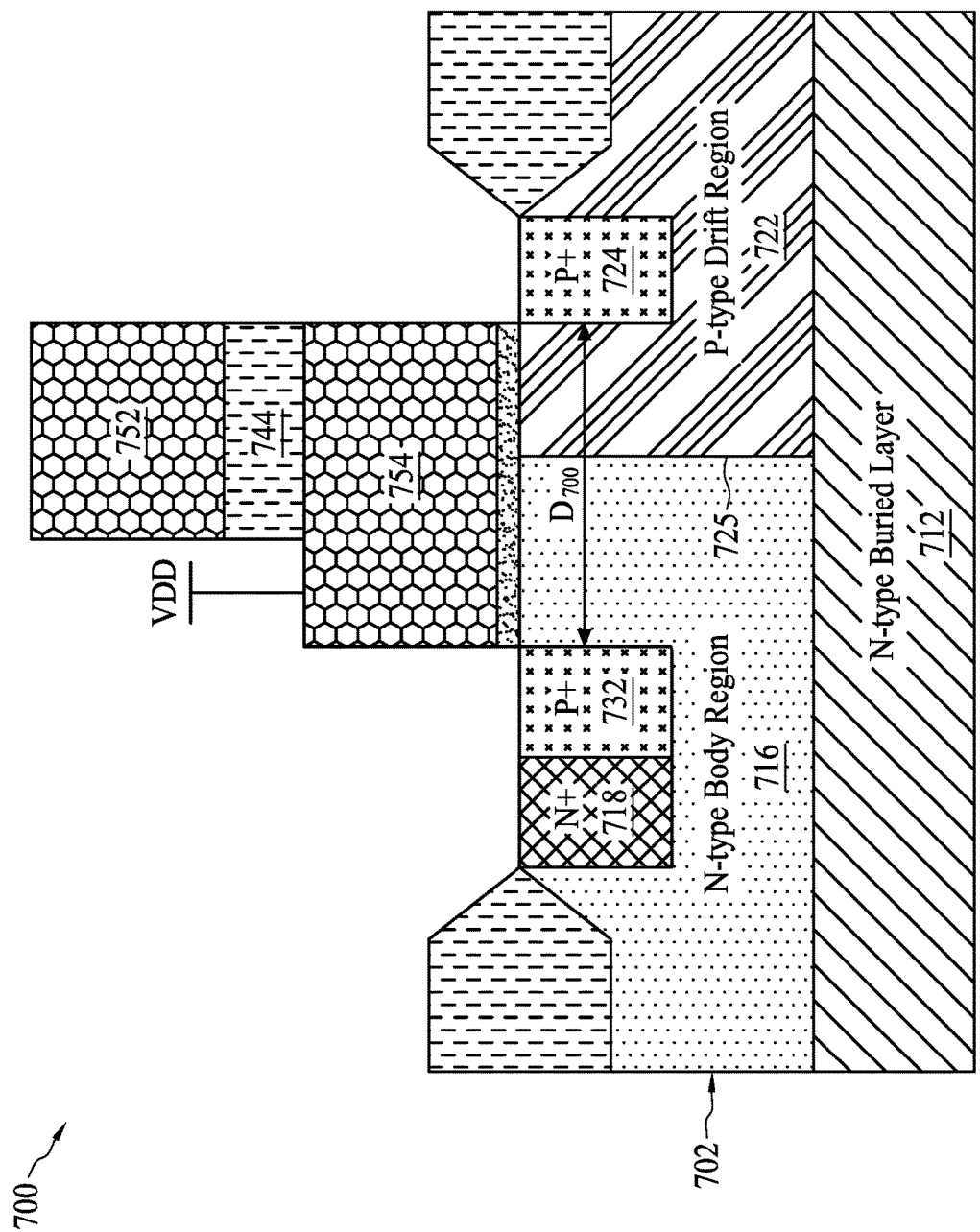
FIG. 8 is a schematic cross-sectional diagram of an FET structure formed with a field plate between a source region and a drain region and serving as an ESD clamp, in accordance with some embodiments.

FET Structure with Field Plate Formed between Source Region and Drain Region FIG. 8 is a schematic cross-sectional diagram of an FET structure 700 formed with a field plate 752 between a source region 732 and a drain region 724 and serving as an ESD clamp, in accordance with some embodiments. The field plate 752 over a gate structure 754 between a source region 732 and a drain region 724 and a distance $D_{700}$ between the source region 732 and a drain region 724 result in breakdown of a pn junction 725 corresponding to a breakdown voltage value $BV_{WFP}'$ between the source region 732 and the drain region 724.

In some embodiments, a field effect transistor (FET) structure 700 is implemented in a BCD process. The FET structure 700 implemented in other processes such as an extended voltage CMOS process, a BiCMOS process, etc. are within the contemplated scope of the present disclosure.

In some embodiments, an FET structure 700 is a lateral diffused metal oxide semiconductor field effect transistor (LDMOS). In some embodiments, the FET structure 700 includes a substrate 702, a gate structure 754 over the substrate 702, a field plate 752 over and at least partially overlapped with the gate structure 754 and an insulating structure 744 interposed at least between the gate structure 754 and the field plate 752 at where the gate structure 754 and the field plate 752 overlap. The substrate 702 includes a buried layer 712, a body region 716, a body doping region 718, a source region 732, a drift region 722 and a drain region 724.

In some embodiments, the FET structure 700 is a P-channel FET structure. A conductivity type of the buried layer 712, the body region 716 and the body doping region 718 is N-type. The body doping region 718 is an N+ doping region. The body region 716 is more lightly doped than the body doping region 718. The conductivity type of the source region 732 is P-type. The source region 732 is a P+ doping region. The conductivity type of the drift region 722 and the drain region 724 is P-type. The drain region is a P+ doping region. The drift region 722 is more lightly doped than the drain region 724.

In some embodiments, the body doping region 718 and the source region 732 are formed in the body region 716. The body region 716 abuts the drift region 722 and a pn junction 725 is formed between the body region 716 and the drift region 722. The drain region 724 is formed in the drift region 722. The buried layer 712 is formed under the body region 716 and the drift region 722 and is connected to the body region 716 and the drift region 722. The gate structure 754 is formed above and between the source region 732 and the drain region 724 and is over the pn junction 725. The field plate 752 is formed over and at least partially overlapped with the gate structure 754. The field plate 752 is formed over the pn junction 725. The insulating structure 744 is interposed at least between the gate structure 754 and the field plate 752 at where the gate structure 754 and the field plate 752 overlap.

In some embodiments, the overlapped gate structure 754 and the field plate 752 spans a distance $D_{700}$ between the source region 732 and the drain region 724. In some embodiments, the gate structure 754 extends from the source region 732 to the drain region 724. The gate structure 754 extending from the source region 732 to the drift region 722 between the pn junction 725 and the drain region 724 is within the contemplated scope of the present disclosure. In some embodiments, the field plate 752 extends from the drain region 724 to the body region 716 between the pn junction 725 and the source region 732. The field plate 752 extending from the drain region 724 to the source region 732 is within the contemplated scope of the present disclosure.

The FET structure 700 includes a parasitic BJT structure. The body doping region 718 and the body region 716 form a base region. The source region 732 forms an emitter region. The drift region 722 and the drain region 724 form a collector region When the FET structure 700 is a P-channel FET structure, the gate structure 754 is tied to VDD for the FET structure 700 to serve as an ESD clamp with the parasitic BJT structure.

A distance $D_{700}$ between the source region 732 and the drain region 724 is similarly defined as a distance $D_{200}$ between the emitter doping region 232 and the collector doping region 224 in FIG. 3. In some embodiments, the distance $D_{700}$ is determined by a breakdown voltage value $BV_{WFP}'$ between the source region 732 and the drain region 724 under an effect of the field plate 752. The distance $D_{700}$ results in a trigger voltage value $Vtl_{WFP}'$ and an on-state resistance $R_{WFP}'$ of the parasitic BJT structure of the FET structure 700. In some embodiments, the breakdown voltage value $BV_{WFP}'$ of the parasitic BJT structure of the FET structure 700 formed with the field plate 752 and having the shorter distance $D_{700}$ is substantially the same as a breakdown voltage value $BV_{WOFF}'$ of an FET structure (not shown) formed without the field plate 752 and having the larger distance corresponding to the distance $D_{700}$. The shorter distance $D_{700}$ results in the smaller trigger voltage value $Vtl_{WFP}'$ and the smaller on-state resistance $R_{WFP}'$.

A multi-finger FET structure (not shown) which includes a plurality of the FET structures 700 and a plurality of symmetrical FET structures each being substantially symmetrical to the FET structure 700 is within the contemplated scope of the present disclosure. One of each adjacent first FET structure and second FET structure is from the plurality of FET structures 700 and the other of the adjacent first FET structure and the second FET structure is from the plurality of symmetrical FET structures. Each adjacent first FET structure and second FET structure are connected by overlapping a drift region 722 and the drain region 724 of the first FET structure with a drift region and a drain region of the second FET structure or overlapping a body region 716, a body doping region 718 and a source region 732 of the second FET structure with a body region, a body doping region and a source region of the first FET structure.

Some embodiments have one or a combination of the following features and/or advantages. In some embodiments, a BJT structure includes a field plate formed over an insulating structure at least partially formed between an emitter doping region and a collector doping region or interposed between an emitter contact and a collector contact. The field plate and a first distance between the emitter doping region and the collector doping region or between the emitter contact and the collector contact results in breakdown of a junction located between the emitter doping region and the collector doping region or between the emitter contact and the collector contact corresponding to a breakdown voltage value between the emitter doping region and the collector doping region or between the emitter contact and the collector contact. Compared to another BJT structure without the field plate, the BJT structure with the field plate has substantially the same or larger breakdown voltage value and the first distance in the BJT structure being smaller than a second distance of the other BJT structure corresponding to the first distance in the BJT structure. The smaller first distance renders the BJT structure having a smaller trigger voltage and a smaller on-state resistance than those of the other BJT structure. In some embodiments, a width of the field plate spans the first distance between the emitter doping region and the collector doping region or overlaps with the first distance between the emitter contact and the collector contact such that the field plate has substantially minimum spacings with the corresponding emitter contact and the collector contact. In this way, a width of a depletion region at the junction varied with an applied voltage to the emitter doping region and collector doping region or the emitter contact and the collector contact, and an applied voltage to the field plate is made within the width of the field plate. In some embodiments, the BJT structure is a multi-finger BJT structure including a plurality of emitter doping regions and a plurality of collector doping regions surrounded by the base region or a plurality of emitter contacts and a plurality of collector contacts over corresponding emitter regions and collector regions surrounded by the base region. A plurality of field plates and a plurality of insulating structures are correspondingly formed with respect to the plurality of emitter doping regions and the plurality of collector doping regions or the plurality of emitter contacts and the plurality of collector contacts. Due to the smaller distance between each pair of the plurality of emitter doping regions and the plurality of collector doping regions, or each pair of the plurality of emitter contact and the plurality of collector contact, an area of the BJT structure is significantly reduced compared to a BJT structure without the plurality of field plates. In some embodiments, an FET structure having a parasitic BJT structure similar to the BJT structure is formed, and a field plate is formed partially over a gate structure between a source region and a drain region.

In some embodiments, a bipolar junction transistor (BJT) structure includes a base region, an emitter region, a collector region, an insulating structure and a field plate. The emitter region is formed in the base region. The emitter region includes an emitter doping region. The collector region includes a collector doping region. The base region forms a junction with the collector region between the emitter doping region and the collector doping region. The insulating structure is at least a portion of which is formed between the emitter doping region and the collector doping region. The field plate is formed over the insulating structure and the junction. A first distance between closer substantial end lines of corresponding bottoms of the corresponding emitter doping region and the collector doping region to the junction is shorter than a second distance and results in breakdown of the junction corresponding to a first breakdown voltage value between the emitter doping region and the collector doping region. The second distance is located in another BJT structure without the field plate. The second distance is between the closer substantial end lines of corresponding bottoms of the corresponding emitter doping region of the other BJT structure and the collector doping region of the other BJT structure to the junction of the other BIT structure and resulting in breakdown of the junction of the other BJT structure corresponding to a second breakdown voltage value between the emitter doping region of the other BJT structure and the collector doping region of the other BJT structure. The first breakdown voltage value is substantially the same or greater than the second breakdown voltage value.

In some embodiments, a bipolar junction transistor (BJT) structure includes a base region, an emitter region, an emitter contact, a collector region, a collector contact, an insulating structure and a field plate. The emitter region is formed in the base region. The emitter contact electrically contacts the emitter region. The collector contact electrically contacts the collector region. The base region forms a junction with the collector region between the emitter contact and the collector contact. The insulating structure is formed between the emitter contact and the collector contact. The field plate is formed over the insulating structure and over the junction. A first distance is between closer lateral sides of the corresponding collector contact and the emitter contact to the junction and at a top surface of the collector region being shorter than a second distance and results in breakdown of the junction corresponding to a first breakdown voltage value between the emitter contact and the collector contact. The second distance is located in another BJT structure without the field plate. The second distance is between the closer lateral sides of the corresponding collector contact of the other BJT structure and the emitter contact of the other BJT structure to the junction of the other BJT structure and at a top surface of the collector region of the other BJT structure and results in breakdown of the junction of the other BJT structure corresponding to a second breakdown voltage value between the emitter contact of the other BJT structure and the collector contact of the other BJT structure. The first breakdown voltage value is substantially the same or greater than the second breakdown voltage value.

In some embodiments, a field effect transistor (FET) structure includes a body region, a source region, a drift region, a drain region, a gate structure, a field plate, and an insulating structure. The source region is formed in the body region. The drain region is formed in the drift region. The drain region is of the same conductivity type as the drift region. The body region forms a junction with the drift region between the source region and the drain region. The gate structure is formed between the source region and the drain region. The field plate is formed over and at least partially overlapped with the gate structure and formed over the junction. The insulating structure is interposed at least between the gate structure and the field plate at where the gate structure and the field plate overlap. The first distance between closer lateral sides of the corresponding source region and the drain region to the junction is shorter than a second distance and results in breakdown of the junction corresponding to a first breakdown voltage value between the source region and the drain region. The second distance is located in another FET structure without the field plate. The second distance is between the closer lateral sides of the corresponding source region of the other FET structure and the drain region of the other FET structure to the junction of the other FET structure and results in breakdown of the junction of the other FET structure corresponding to a second breakdown voltage value between the source region of the other FET structure and the drain region of the other FET structure. The first breakdown voltage value is substantially the same or greater than the second breakdown voltage value.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A bipolar junction transistor (BJT) structure, comprising:
 a base region;
 an emitter region formed in the base region, the emitter region comprising an emitter doping region;

a collector region, the collector region comprising a collector doping region;

an insulating structure at least a portion of which is interposed between the emitter doping region and the collector doping region; and a field plate formed over the insulating structure and a junction between the collector region and the base region, wherein a width of the field plate spans a first distance between closer substantial end lines of corresponding bottoms of the corresponding emitter doping region and the collector doping region to the junction and the first distance results in breakdown of the junction corresponding to a first breakdown voltage value between the emitter doping region and the collector doping region.

2. The BJT structure of claim 1, wherein the insulating structure is formed above the emitter doping region and the collector doping region.

3. The BJT structure of claim 1, wherein the base region surrounds the collector region.

4. The BJT structure of claim 1, wherein
the base region comprises:
a first well;
the emitter region being formed in the first well;
a second well forming a second junction with the collector region on opposite sides of the junction; and
a buried layer under the first well, the second well and the collector region, and connected to the first well and the second well.

5. The BJT structure of claim 1, further comprising:
at least one another emitter region formed in the base region;
another plurality of collector regions;
the base region forming another plurality of junctions with the other plurality of collector regions; and
each junction of the other plurality of junctions being formed between the corresponding emitter doping region of the emitter region and the at least one other emitter region, and the corresponding collector doping region of the other plurality of collector regions;
another plurality of insulating structures each of which is formed at least partially between the corresponding emitter doping region of the emitter region and the at least one other emitter region and the corresponding collector doping region of the other plurality of collector regions; and
another plurality of field plates formed over the corresponding other plurality of insulating structures;
another plurality of first distances each of which is between a first substantial end line of a first bottom of the corresponding emitter doping region of the emitter region and the at least one other emitter region and a second substantial end line of a second bottom of the corresponding collector doping region of the other plurality of collector regions and results in the first breakdown voltage value;
the first substantial end line of the first bottom and the second substantial end line of the second bottom for the first distance being closer to the corresponding junction of the plurality of junctions.

6. The BJT structure of claim 5, wherein the base region surrounds the emitter region, the at least one other emitter region, the collector region and the other plurality of collector regions.

7. The BJT structure of claim 1, wherein the emitter region is p-type, the base region is n-type and the collector region is p-type.

8. The BJT structure of claim 1, wherein the insulating structure is over the junction.

9. The BJT structure of claim 1, wherein the junction is closer to the emitter region than the collector region.

10. A bipolar junction transistor (BJT) structure, comprising:
a base region;
an emitter region formed in the base region;
an emitter contact electrically contacting the emitter region;
a collector region;
a collector contact electrically contacting the collector region;
the base region forming a junction with the collector region between the emitter contact and the collector contact;
an insulating structure formed between the emitter contact and the collector contact; and
a field plate formed over the insulating structure and over the junction, the field plate being not exceeding a boundary of the insulating structure from a top view;
a first distance between closer lateral sides of the corresponding collector contact and the emitter contact to the junction and at a top surface of the collector region resulting in breakdown of the junction corresponding to a first breakdown voltage value between the emitter contact and the collector contact.

11. The BJT structure of claim 10, wherein
a width of the field plate overlaps with a portion of the first distance.

12. The BJT structure of claim 10, wherein the insulating structure is below the emitter contact and the collector contact.

13. The BJT structure of claim 10, wherein the insulating structure is interposed between the emitter contact and the collector contact.

14. The BJT structure of claim 10, wherein the base region surrounds the collector region.

15. The BJT structure of claim 10, wherein
the base region comprises:
a first well;
the emitter region being formed in the first well;
a second well forming a second junction with the collector region on opposite sides of the junction; and
a buried layer under the first well, the second well and the collector region, and connected to the first well and the second well.

16. The BJT structure of claim 10, further comprising:
at least one another emitter regions formed in the base region;
at least one another emitter contacts electrically contacting the corresponding at least one other emitter region;
another plurality of collector regions;
another plurality of collector contacts electrically contacting the corresponding other plurality of collector regions;
the base region forming another plurality of junctions with the other plurality of collector regions; and
each junction of the other plurality of junctions being formed between the corresponding emitter contact of the emitter contact and the at least one other emitter contact, and the corresponding collector contact of the other plurality of collector contacts;

another plurality of insulating structures each of which is
formed between the corresponding emitter contact of
the emitter contact and the at least one other emitter
contact and the corresponding collector contact of the
other plurality of collector contacts; and another plurality of field plates formed over the corresponding other plurality of insulating structures;

another plurality of first distances each of which is between closer lateral sides of the corresponding emitter contact of the emitter contact and the at least one other emitter contact and the corresponding collector contact of the other plurality of collector contacts to the corresponding junction of the plurality of junctions and results in the first breakdown voltage value.

17. The BJT structure of claim 16, wherein the base region surrounds the emitter region, the at least one other emitter region, the collector region and the other plurality of collector regions.

18. The BJT structure of claim 10, wherein the emitter region is p-type, the base region is n-type and the collector region is p-type.

19. A field effect transistor (FET) structure, comprising:
a body region;
a source region formed in the body region;
a drift region;
a drain region formed in the drift region;
  the drain region being of the same conductivity type as the drift region;
  the body region forming a junction with the drift region between the source region and the drain region;
a gate structure extending continuously from the source region to the drain region;
a field plate formed over and at least partially overlapped with the gate structure and formed over the junction; and
an insulating structure interposed at least between the gate structure and the field plate at where the gate structure and the field plate overlap;
  wherein a portion of a top surface of the gate structure is free from overlapping with the field plate.

20. The FET structure of claim 19, wherein the source region is p-type, the body region is n-type, the drift region is p-type and the drain region is p-type.

* * * * *